(12) United States Patent
Li et al.

(10) Patent No.: US 10,811,510 B2
(45) Date of Patent: Oct. 20, 2020

(54) THIN FILM TRANSISTOR, MANUFACTURING METHOD THEREOF, ARRAY SUBSTRATE, DISPLAY PANEL, AND DISPLAY DEVICE

(71) Applicant: BOE Technology Group Co., Ltd., Beijing (CN)

(72) Inventors: Haixu Li, Beijing (CN); Zhanfeng Cao, Beijing (CN); Qi Yao, Beijing (CN); Jianguo Wang, Beijing (CN); Fanna Meng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 8 days.

(21) Appl. No.: 16/333,102

(22) PCT Filed: May 8, 2018

(86) PCT No.: PCT/CN2018/086032
§ 371 (c)(1),
(2) Date: Mar. 13, 2019

(87) PCT Pub. No.: WO2018/205930
PCT Pub. Date: Nov. 15, 2018

(65) Prior Publication Data
US 2019/0363170 A1   Nov. 28, 2019

(30) Foreign Application Priority Data

May 8, 2017 (CN) .......................... 2017 1 0318516

(51) Int. Cl.
*H01L 29/43* (2006.01)
*H01L 29/40* (2006.01)
(Continued)

(52) U.S. Cl.
CPC .......... *H01L 29/437* (2013.01); *H01L 29/401* (2013.01); *H01L 29/458* (2013.01);
(Continued)

(58) Field of Classification Search
CPC .................................................... H01L 29/4908
See application file for complete search history.

(56) References Cited

U.S. PATENT DOCUMENTS

2003/0098445 A1* 5/2003 Higuma .................... G01J 5/20
252/500
2005/0285102 A1  12/2005 Koo et al.
(Continued)

FOREIGN PATENT DOCUMENTS

CN          1713409 A     12/2005
CN        101192643 A      6/2008
(Continued)

OTHER PUBLICATIONS

First Office Action and English language translation, CN Application No. 201710318516.4, dated Jun. 25, 2019, 18 pp.
(Continued)

*Primary Examiner* — Thao P Le
(74) *Attorney, Agent, or Firm* — Myers Bigel, P.A.

(57) ABSTRACT

A thin film transistor, a manufacturing method thereof, an array substrate, a display panel, and a display device are disclosed. The present disclosure is directed to the field of display technologies. The thin film transistor comprises a drain electrode and a source electrode. At least one of the drain electrode and the source electrode are an yttrium-doped first metal film, and a surface of the first metal film is yttrium-copper complex oxide formed by annealing.

15 Claims, 4 Drawing Sheets

(51) Int. Cl.
*H01L 29/45* (2006.01)
*H01L 29/49* (2006.01)
*H01L 29/66* (2006.01)
*H01L 29/786* (2006.01)

(52) U.S. Cl.
CPC .... *H01L 29/4908* (2013.01); *H01L 29/66757* (2013.01); *H01L 29/66765* (2013.01); *H01L 29/78618* (2013.01)

(56) References Cited

U.S. PATENT DOCUMENTS

| | | | |
|---|---|---|---|
| 2009/0170709 | A1 | 7/2009 | Allais et al. |
| 2009/0303406 | A1 | 12/2009 | Takasawa et al. |
| 2010/0140623 | A1* | 6/2010 | Min .................. H01L 27/1248 257/59 |
| 2011/0101337 | A1 | 5/2011 | Yamazaki |
| 2012/0049183 | A1 | 3/2012 | Yamazaki |
| 2013/0248227 | A1 | 9/2013 | Kim et al. |
| 2014/0117359 | A1* | 5/2014 | Yuan .................. H01L 27/1225 257/59 |
| 2014/0361291 | A1 | 12/2014 | Sasagawa et al. |
| 2020/0098880 | A1* | 3/2020 | Sharma ............ H01L 27/10805 |
| 2020/0098887 | A1* | 3/2020 | Dewey ................ H01L 27/088 |

FOREIGN PATENT DOCUMENTS

| | | |
|---|---|---|
| CN | 101529566 A | 9/2009 |
| CN | 102386071 A | 3/2012 |
| CN | 102664153 A | 9/2012 |
| CN | 102668095 A | 9/2012 |
| CN | 103210453 A | 7/2013 |
| CN | 106910780 A | 6/2017 |

OTHER PUBLICATIONS

International Search Report and Written Opinion of the International Searching Authority (with English language translation of Written Opinion), International Application No. PCT/CN2018/086032, dated Jul. 18, 2018, 12 pp.

Second Office Action and English language translation, CN Application No. 201710318516.4, dated May 19, 2020, 20 pp.

Meng Xiangfeng, "Effect of Rare Earth Yttrium on the Structure and Conductivity of Pure Copper", New Observation, Dec. 31, 2015, p. 62.

* cited by examiner

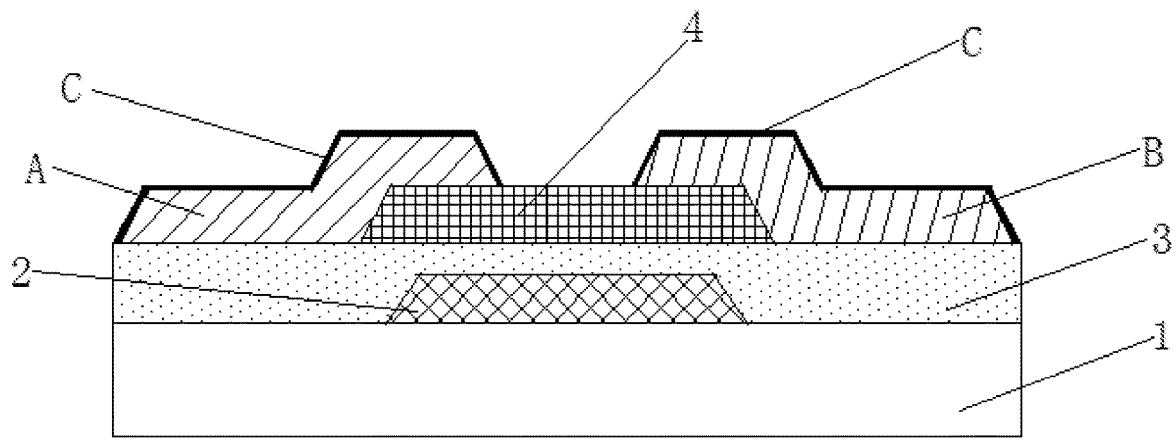
Fig. 1
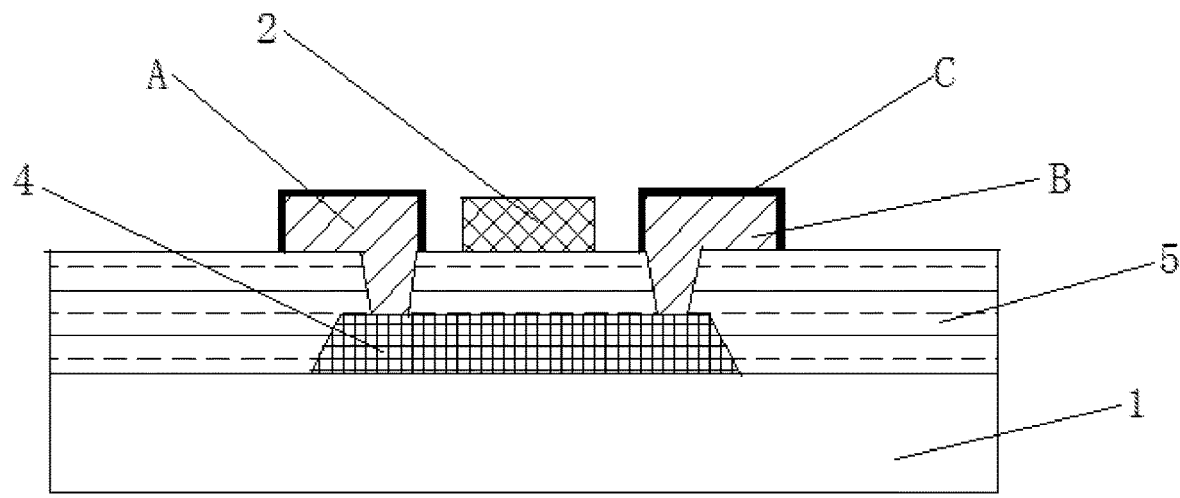
Fig. 2
| forming a drain and a source, wherein the drain and/or the source are an yttrium-doped and copper-containing first metal film | 101 |
| annealing the first metal film | 102 |
Fig. 3

US 10,811,510 B2

THIN FILM TRANSISTOR, MANUFACTURING METHOD THEREOF, ARRAY SUBSTRATE, DISPLAY PANEL, AND DISPLAY DEVICE

CROSS REFERENCE TO RELATED APPLICATIONS

The present application is a 35 U.S.C. 371 national stage application of PCT International Application No. PCT/CN2018/086032, filed on May 8, 2018, which claims the benefit of Chinese Patent Application No. 201710318516.4, filed on May 8, 2017, the contents of which are incorporated herein by reference in their entireties. The above-referenced PCT International Application was published in the Chinese language as International Publication No. WO 2018/205930 A1 on Nov. 15, 2018.

TECHNICAL FIELD

The present disclosure relates to the field of display technology, and in particular, to a thin film transistor, a manufacturing method thereof, an array substrate, a display panel, and a display device.

BACKGROUND

In the field of display technologies, a flat panel display device, such as a liquid crystal display (LCD), occupies an important position in the field of flat panel display because of their advantages of lightness, thinness, low power consumption, high brightness, high image quality, or the like. Especially, large-sized, high-resolution, and high image quality flat panel display devices, such as LCD TVs, have occupied a dominant position in the current flat panel display device market. At present, customers' requirements for display panels are also increasing, followed by an increase in requirements of response time, power consumption and resolution of display panels. Thin film transistors (TFTs) are key components in liquid crystal display devices and play a very important role in the operation performances of display devices. TFTs with improved performances are desired in the art.

SUMMARY

In a first aspect, a thin film transistor is provided, comprising a drain electrode, a source electrode, and, and a gate electrode, wherein at least one of the drain electrode, the source electrode, and, and the gate electrode comprises an yttrium (Y)-doped and copper-containing first metal film and yttrium-copper oxide on a surface of the metal film.

In some embodiments of the present disclosure, the metal film comprises copper or a copper alloy.

In some embodiments of the present disclosure, the first metal film comprises copper, and yttrium is doped by a mass fraction of less than about 0.06% and more than about 0.005%.

In some embodiments of the present disclosure, yttrium is doped by a mass fraction of about 0.02%.

In an implementation of embodiments of the present disclosure, the yttrium-copper oxide on the surface of the second metal film is formed by annealing.

In some embodiments of the present disclosure, the yttrium-copper oxide on the surface of the metal film comprises oxide of a complex $Y_2Cu_8$.

In a second aspect, a method of manufacturing a thin film transistor is provided, comprising:

forming a drain electrode, a source electrode, and a gate electrode, wherein at least one of the drain electrode, the source electrode, and the gate electrode comprises an yttrium-doped and copper-containing metal film; and forming yttrium-copper oxide on a surface of the metal film.

In some embodiments of the present disclosure, the first metal film comprises copper or a copper alloy.

In some embodiments of the present disclosure, the first metal film comprises copper, and yttrium is doped by a mass fraction of less than about 0.06% and more than about 0.005%.

In some embodiments of the present disclosure, yttrium is doped by a mass fraction of about 0.02%.

In an implementation of embodiments of the present disclosure, forming yttrium-copper oxide on a surface of the metal film comprises:

annealing the metal film to form yttrium-copper oxide on the surface of the metal film.

In some embodiments of the present disclosure, forming yttrium-copper oxide on a surface of the metal film comprises: annealing the metal film to form oxide of a complex $Y_2Cu_8$ on the surface of the metal film.

In a third aspect, an array substrate comprising the thin film transistor of the first aspect is provided.

In a fourth aspect, a display panel comprising the array substrate of the third aspect is provided.

In a fifth aspect, a display device comprising the display panel of the fourth aspect is provided.

BRIEF DESCRIPTION OF THE DRAWINGS

In order to more clearly illustrate the technical solutions in the embodiments of the present disclosure, the drawings need to be used in the description of the embodiments will be briefly introduced hereinafter. It is obvious that the drawings in the following description are only some embodiments of the present disclosure. Other drawings may also be obtained from these drawings to those of ordinary skill in the art without creative work.

FIG. 1 is a schematic structural diagram of a thin film transistor in an embodiment of the present disclosure;

FIG. 2 is a schematic structural diagram of another thin film transistor in an embodiment of the present disclosure;

FIG. 3 is a flow chart of a method of manufacturing a thin film transistor in an embodiment of the present disclosure;

DETAILED DESCRIPTION OF EMBODIMENTS

Figure 4:
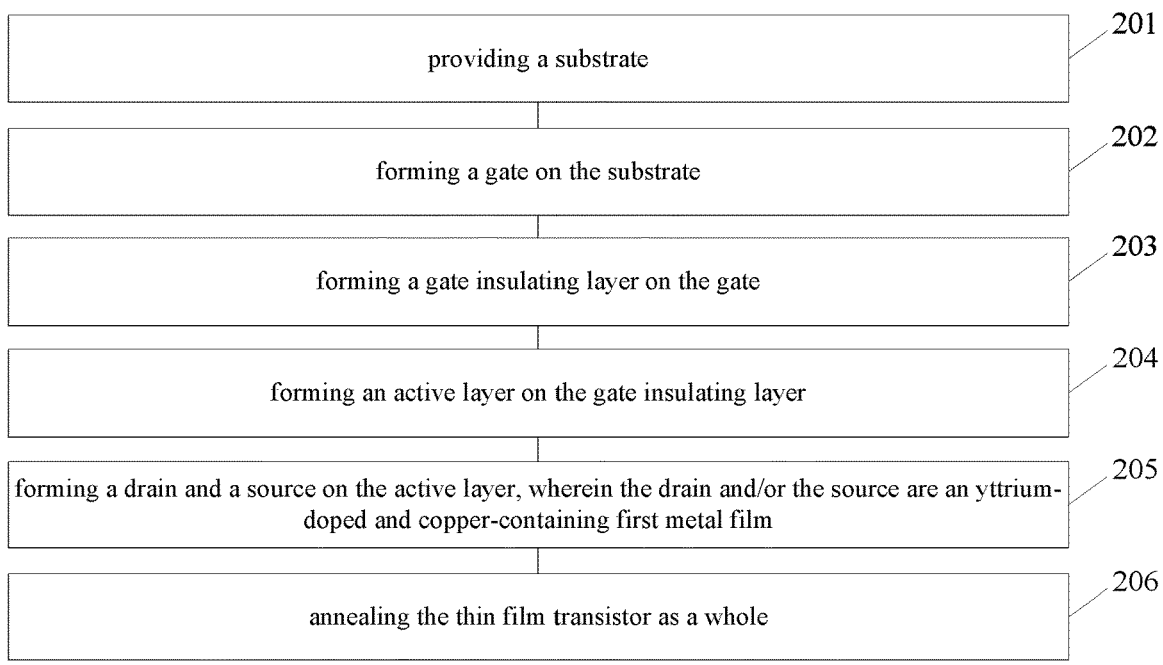
FIG. 4 is a flow chart of another method of manufacturing a thin film transistor in an embodiment of the present disclosure.

In order to make the objects, technical solutions and advantages of the present disclosure more clear, the embodiments of the present disclosure will be further described in detail hereinafter with reference to the accompanying drawings.

At present, metal layer materials in the thin film transistor may be chosen as materials with small resistance and high conductivity, so as to reduce power consumption, reduce voltage drop, and improve response speed. Among them, copper (Cu) is generally chosen as the material of the drain electrode and source electrode. Copper has low resistivity and good resistance to electromigration, and can meet the requirements of large size, high resolution and high driving frequency of the display device.

However, copper itself is easily oxidized by contact with oxygen and moisture due to its active nature, so that the contact resistance between the drain electrode and source electrode and the pixel electrode is increased, thereby affecting the property of the thin film transistor.

In order to solve the problem of easy oxidation of the drain electrode and the source electrode and increase in the contact resistance between the drain electrode and source electrode and the pixel electrode, embodiments of the present disclosure provide a thin film transistor, a manufacturing method thereof, an array substrate, a display panel, and a display device.

An embodiment of the present disclosure provides a thin film transistor comprising a drain electrode A and a source electrode B. At least one of the drain electrode A and the source electrode B are an yttrium-doped and copper-containing first metal film, and a surface of the first metal film is yttrium-copper oxide formed by annealing.

At least one of the drain electrode A and the source electrode B of the thin film transistor in an embodiment of the present disclosure have good conductivity and oxidation resistance for the following reasons.

In terms of conductivity, as compared with the copper element, the yttrium element is more easily to form a compound with elements such as oxygen, sulfur and the like to form a rare earth compound with a high melting point, a high thermal stability, a small specific gravity, and a small size. If the yttrium element is added to the copper or the copper alloy, the yttrium element will rob the oxygen and sulfur atoms combined with the copper element to produce a compound with a smaller size. This reduces the lattice distortion of copper, reduces the electron scattering probability, and reduces the resistivity. Thereby, the conductivity of the copper or the copper alloy is improved. The effect of a concentration of yttrium element on the conductivity of copper is listed in the table below.

| | Addition amount (wt. %) of yttrium | | | | | |
|---|---|---|---|---|---|---|
| | 0 | 0.02 | 0.04 | 0.06 | 0.08 | 0.1 |
| Conductivity (MSm$^{-1}$) | 57.9 | 59.9 | 59.2 | 58.9 | 38 | 36 |

It can be seen from the above table that, within a certain mass fraction range, the conductivity of pure copper is gradually increased with increasing amount of the yttrium element added. Thus, by doping the copper-containing first metal film with yttrium, the conductivity of the copper-containing first metal film can be improved.

In terms of oxidation resistance, the yttrium element and the copper element can be combined into a complex $Y_2Cu_8$. The oxide film of the complex is so dense that an effective barrier layer can be formed on the surface of the copper or the copper alloy and prevent further oxidation of oxygen and copper. Moreover, the oxide formed by the reaction of the complex with oxygen has a superconductor structure, so that the oxide film can effectively protect the copper or the copper alloy from being oxidized, and may not affect the overall conductivity of the copper or the copper alloy.

It is worth noting that, after adding the yttrium element to the copper or the copper alloy, it is necessary to anneal the copper or the copper alloy, so that the yttrium element inside the copper or the copper alloy is concentrated on the surface of the copper or the copper alloy and a dense oxide can be further formed on the surface of the copper or the copper alloy.

In summary, by arranging at least one of the drain electrode and the source electrode of the thin film transistor as an yttrium-doped and copper-containing first metal film which has been annealed, the conductivity and the oxidation resistance of at least one of the drain electrode and the source electrode can be improved, and the contact resistance between the drain electrode and the source electrode and a structure in contact therewith can be reduced. For example, by arranging the drain electrode as an yttrium-doped and copper-containing first metal film which has been annealed, the contact resistance between the drain electrode and the pixel electrode can be reduced, and the performance of the thin film transistor can be more stable. For example, the response time of the thin film transistor can be decreased.

In an embodiment of the present disclosure, the first metal film comprises copper or a copper alloy.

For example, the first metal film comprises copper.

Further, in the embodiment, in order to improve the conductivity of at least one of the drain electrode and the source electrode of the thin film transistor, yttrium is doped by a doping amount (that is, the amount added to the copper) with a mass fraction of less than about 0.06% and more than about 0.005%.

For example, yttrium is doped by a mass fraction of about 0.02%. At least one of the drain electrode and the source electrode with higher conductivity can be obtained with the above example values.

In an embodiment of the present disclosure, the yttrium-doped and copper-containing first metal film is annealed at a temperature of 150-250° C. (e.g., 150° C., 160° C., 170° C., 180° C., 190° C., 200° C., 210° C., 220° C., 230° C., 240° C., 250° C., etc.), in an atmosphere of air, with a duration of about 0.5-1 hr (hour) (e.g., 0.5 hr, 0.6 hr, 0.7 hr, 0.8 hr, 0.9 hr, 1 hr, etc.).

The thin film transistor in embodiments of the present disclosure comprises a thin film transistor of a bottom gate structure and a thin film transistor of a top gate structure.

FIG. 1 shows a thin film transistor of a bottom gate structure. As shown in FIG. 1, the thin film transistor of a bottom gate structure comprises: a substrate 1, a gate electrode 2 formed on the substrate 1, a gate insulating layer 3 formed on the gate electrode 2, an active layer 4 formed on the gate insulating layer 3, and a drain electrode A and a source electrode B formed on the active layer 4.

FIG. 2 shows a thin film transistor of a top gate structure. As shown in FIG. 2, the thin film transistor of a top gate structure comprises: a substrate 1, an active layer 4 formed on the substrate 1, an etching barrier layer 5 formed on the active layer 4 and provided with a via 501 (see FIG. 9), and a gate electrode 2, a drain electrode A, and a source electrode B formed on the etching barrier layer 5. The drain electrode A and the source electrode B are connected to the active layer 4 through the via 501.

In the thin film transistors provided in FIG. 1 and FIG. 2, a buffer layer is not arranged on at least one of the drain electrode A and the source electrode B. In the existing art, a buffer layer is arranged on the drain electrode A and the source electrode B to prevent the drain electrode A and the source electrode B from being oxidized. The buffer layer is typically a metal film. However, the buffer layer is added, the following problems arise. When two metal layers (comprising the metal layer where the drain electrode A and the source electrode B are located and the buffer layer) are simultaneously etched, the buffer layer is etched more slowly, a tip structure (i.e., the roof structure) is formed, which affects laminating of the subsequent films.

It can be seen that, since at least one of the drain electrode A and the source electrode B in an embodiment of the present disclosure is an yttrium-doped and copper-containing first metal film which has been annealed, a dense oxide layer C is formed on the surface of at least one of the drain electrode A and the source electrode B (see FIG. 1 and FIG. 2). In this case, it's not necessary to arrange a buffer layer on at least one of the drain electrode A and the source electrode B in the thin film transistor of the embodiment of the present disclosure. This not only simplifies the process of manufacturing the thin film transistor, but also avoids the formation of a tip structure (i.e., a roof structure) during simultaneously etching two stacked metal layers (comprising the metal layer where at least one of the drain electrode A and the source electrode B is located, and the buffer layer).

It should be noted that both the drain electrode A and the source electrode B of the thin film transistor shown in FIG. 1 and FIG. 2 are arranged as the yttrium-doped and copper-containing first metal film, and both the drain electrode A and the source electrode B are annealed. In an embodiment of the present disclosure, the substrate 1 in the thin film transistor of a bottom gate structure or a top gate structure may be a transparent substrate, e.g. a glass substrate, a silicon substrate, and a plastic substrate, or the like.

In an embodiment of the present disclosure, the gate electrode 2 in the thin film transistor of a bottom gate structure or a top gate structure may be a metal electrode, e.g. Al (aluminum), Cu (copper), Mo (molybdenum), Cr (chromium), Ti (titanium), and the like. The gate electrode 2 can also be formed by a multiple-layer metal stack.

For example, the gate electrode is arranged as an yttrium-doped and copper-containing second metal film, and the surface of the second metal film is yttrium-copper oxide formed by annealing. In this way, the conductivity of the gate electrode can be improved, and the oxidation resistance can also be improved.

In an embodiment of the present disclosure, the gate insulating layer 3 in the thin film transistor of a bottom gate structure may be a silicon nitride or silicon oxynitride layer.

In an embodiment of the present disclosure, the etching barrier layer 5 in the thin film transistor of a top gate structure may be a material such as aluminum oxide, zirconium oxide or the like.

In an embodiment of the present disclosure, the active layer 4 in the thin film transistor of a bottom gate structure or a top gate structure may be made of amorphous silicon, polycrystalline silicon, oxide, or the like.

FIG. 3 is a flow chart of a method of manufacturing a thin film transistor in an embodiment of the present disclosure. Referring to FIG. 3, the method comprises the following steps.

Step 101: forming a drain electrode A and a source electrode B, wherein at least one of the drain electrode A and the source electrode B are an yttrium-doped and copper-containing first metal film.

In an embodiment of the present disclosure, the first metal film comprises copper or a copper alloy.

For example, the first metal film comprises copper.

Further, in the embodiment, in order to improve the conductivity of at least one of the drain electrode the source electrode of the thin film transistor, yttrium is doped by a doping amount (that is, the amount added to the copper) with a mass fraction of less than about 0.06% and more than about 0.005%.

For example, yttrium is doped by a mass fraction of about 0.02%. At least one of the drain electrode and the source electrode with higher conductivity can be obtained with the above example values.

Step 102: annealing the first metal film to form yttrium-copper oxide on a surface of the first metal film.

After annealing, a dense oxide layer C of the complex $Y_2Cu_8$ can be formed on the surface of at least one of the drain electrode A and the source electrode B.

In an embodiment of the present disclosure, the yttrium-doped and copper-containing first metal film is annealed at a temperature of 150-250° C. (e.g., 150° C., 160° C., 170° C., 180° C., 190° C., 200° C., 210° C., 220° C., 230° C., 240° C., 250° C., etc.), in an atmosphere of air, with a duration of about 0.5-1 hr (e.g., 0.5 hr, 0.6 hr, 0.7 hr, 0.8 hr, 0.9 hr, 1 hr, etc.).

In an implementation of embodiments of the present disclosure, at least one of the drain electrode A and the source electrode B containing yttrium by a mass fraction of about 0.06% are annealed (at a temperature of 250° C., in an atmosphere of air, with a duration of 0.5 hr), and a thin film transistor with a conductivity up to 58 Ms/m and an improved oxidation resistance is obtained.

In another implementation of embodiments of the present disclosure, at least one of the drain electrode A and the source electrode B containing yttrium by a mass fraction of about 0.02% are annealed (at a temperature of 250° C., in an atmosphere of air, with a duration of 0.5 hr), and a thin film transistor with a conductivity up to 59 Ms/m and an improved oxidation resistance is obtained.

It can be seen that, by arranging at least one of the drain electrode and the source electrode of the thin film transistor as an yttrium-doped and copper-containing first metal film which has been annealed, the conductivity and the oxidation resistance of at least one of the drain electrode and the source electrode can be improved, and the contact resistance between the drain electrode and the source electrode and a structure in contact therewith can be reduced. This makes the performance of the thin film transistor more stable. For example, the response time of the thin film transistor can be decreased.

FIG. 4 is a flow chart of another method of manufacturing a thin film transistor in an embodiment of the present disclosure. As shown in FIG. 4, the method comprises the following steps.

Step 201: providing a substrate 1.

The substrate 1 may be a transparent substrate, e.g. a glass substrate, a silicon substrate, and a plastic substrate, or the like. Optionally, the substrate 1 may be cleaned in advance to ensure the cleanness of the substrate 1.

Step 202: forming a gate electrode 2 on the substrate 1.

Figure 5:
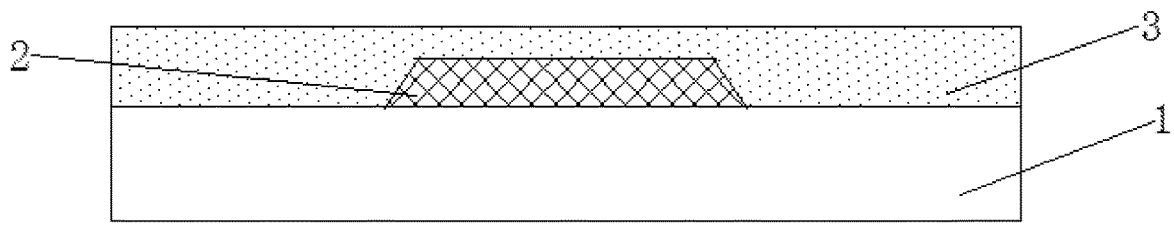
FIG. 5 is a schematic structural diagram during manufacturing a thin film transistor in an embodiment of the present disclosure.

As shown in FIG. 5, the gate electrode 2 can be formed on the substrate 1 by performing a patterning process for one time. For example, a metal layer is formed on the substrate 1 by sputtering method, and then the gate electrode 2 is obtained by an etching process.

The gate electrode 2 may be a metal electrode, e.g. Al (aluminum), Cu (copper), Mo (molybdenum), Cr (chromium), or Ti (titanium), and the like. The gate electrode 2 may also be formed by a multiple-layer metal stack.

For example, the gate electrode is arranged as an yttrium-doped and copper-containing second metal film to improve the conductivity and oxidation resistance of the gate electrode. In order to concentrate the yttrium element in the second metal film on the surface of the second metal film to form dense oxide, it is necessary to anneal the second metal film. The annealing process of the second metal film may be performed simultaneously with the first metal film (see step 206), and the order of the above-mentioned two annealing processes is not limited herein.

Step 203: forming a gate insulating layer 3 on the gate electrode 2.

As shown in FIG. 5, after the gate electrode 2 is formed, the gate insulating layer 3 is formed on the substrate 1 on which the gate electrode 2 has been formed. For example, a gate insulating layer 3 is deposited on the substrate 1 on which the gate electrode 2 has been formed. The gate electrode insulating layer 3 may be a layer of silicon nitride or silicon oxynitride.

Step 204: forming an active layer 4 on the gate insulating layer 3.

After the gate insulating layer 3 is formed, the active layer 4 can be formed by performing a patterning process for one time. For example, the active layer 4 is firstly formed on the gate insulating layer 3 by deposition, e.g. plasma-enhanced chemical vapor deposition (PECVD), and then etched, e.g. by inductively coupled plasma (ICP), so as to form the active layer 4 shown in FIG. 6. The active layer 4 can be made of amorphous silicon, polycrystalline silicon, oxide, or the like.

Step 205: forming a drain electrode A and a source electrode B on the active layer 4, wherein at least one of the drain electrode A and the source electrode B are the yttrium-doped and copper-containing first metal film.

Figure 6:
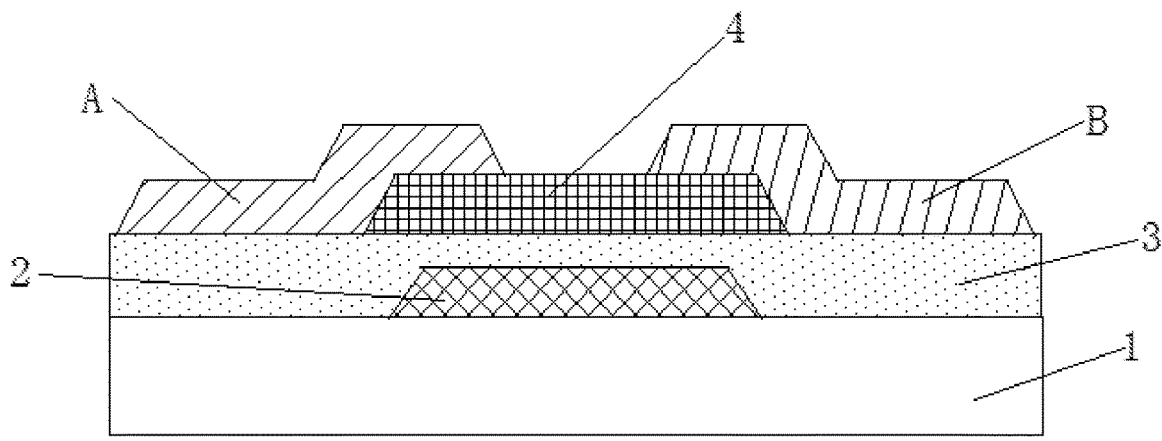
FIG. 6 is a schematic structural diagram during manufacturing a thin film transistor in an embodiment of the present disclosure.

As shown in FIG. 6, after the active layer 4 is formed, the drain electrode A and the source electrode B may be formed by performing a patterning process for one time on the substrate 1 on which the active layer 4 has been formed. In an embodiment of the present disclosure, the drain electrode A and the source electrode B as shown in FIG. 6 may be formed by a magnetron sputtering process followed by an etching process. A target for depositing at least one of the drain electrode A and the source electrode B is a copper plate doped with the yttrium element.

Step 206: annealing the thin film transistor as a whole.

After the drain electrode A and the source electrode B are formed on the active layer 4, the thin film transistor is annealed as a whole to form a dense oxide layer C of the complex $Y_2Cu_8$ on the surfaces of the drain electrode A and the source electrode B (see FIG. 1). In the same way, the same chemical process also occurs on the gate electrode.

The dense oxide layer C of the complex $Y_2Cu_8$ has a property of being dense and superconducting. As a result, the oxide layer C can effectively block the oxygen from contacting the surface of the first metal film to cause oxidation and affect the property of the thin film transistor, but not affect the overall conductivity of the thin film transistor.

In this embodiment, the thin film transistor (i.e., the yttrium-doped and copper-containing first and second metal film) is annealed at a temperature of 150-250° C. (e.g., 150° C., 160° C., 170° C., 180° C., 190° C., 200° C., 210° C., 220° C., 230° C., 240° C., 250° C., etc.), in an atmosphere of air, with a duration of about 0.5-1 hr (e.g., 0.5 hr, 0.6 hr, 0.7 hr, 0.8 hr, 0.9 hr, 1 hr, etc.).

Since at least one of the drain electrode A and the source electrode B in an embodiment of the present disclosure is the first metal film which is doped with the yttrium element and has been annealed, the oxide layer C is formed on the surface of at least one of the drain electrode A and the source electrode B respectively (see FIG. 1). In this way, it's not necessary to arrange a buffer layer on at least one of the drain electrode A and the source electrode B in the thin film transistor of the embodiment of the present disclosure, which not only simplifies the process of manufacturing the thin film transistor, but also avoids the problem of uniform etching in case the buffer layer is arranged on at least one of the drain electrode A and the source electrode B. Thereby, the formation of a tip structure (i.e., a roof structure) during simultaneous etching of two layers of stacked metal layers (comprising the metal layer where at least one of the drain electrode A and the source electrode B is located, and the buffer layer) is avoided.

In the embodiments of the present disclosure, by arranging at least one of the drain electrode and the source electrode of the thin film transistor as a first metal film which is doped with the yttrium element and has been annealed, the conductivity and the oxidation resistance of at least one of the drain electrode and the source electrode can be improved, and the contact resistance between the drain electrode and the source electrode and the structure in contact therewith can be reduced. This makes the performance of the thin film transistor more stable. For example, the response time of the thin film transistor can be decreased.

Figure 7:
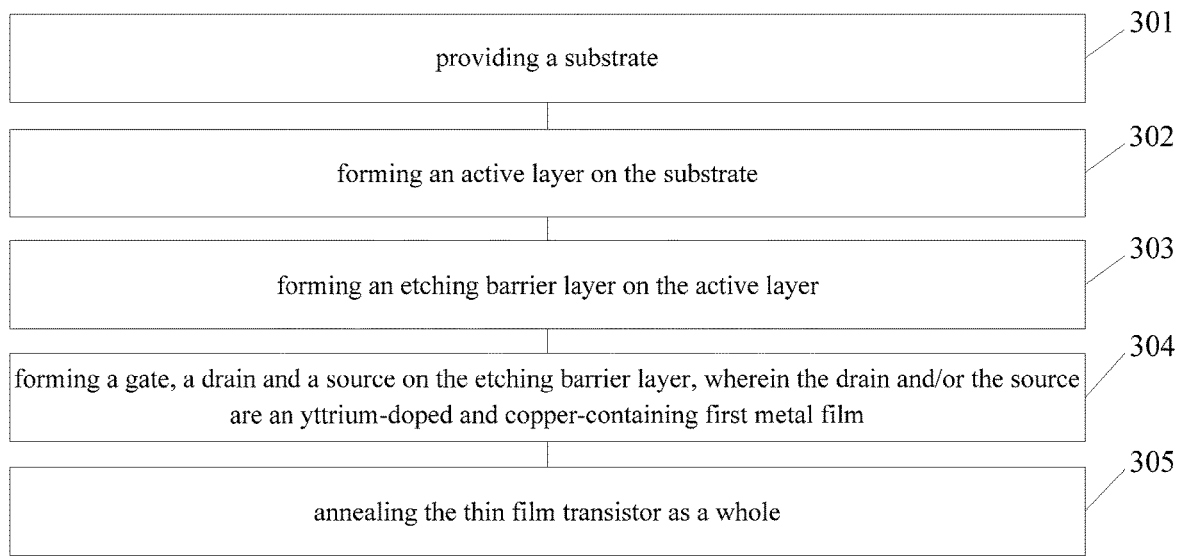
FIG. 7 is a flow chart of another method of manufacturing a thin film transistor in an embodiment of the present disclosure.

FIG. 7 is a flow chart of another method of manufacturing a thin film transistor in an embodiment of the present disclosure. As shown in FIG. 7, in an embodiment of the present disclosure, the method comprises the following steps.

Step 301: providing a substrate 1.

The substrate 1 may be a transparent substrate, e.g. a glass substrate, a silicon substrate, and a plastic substrate, or the like. Optionally, the substrate 1 may be cleaned in advance to ensure the cleanness of the substrate 1.

Step 302: forming an active layer 4 on the substrate 1.

Figure 8:
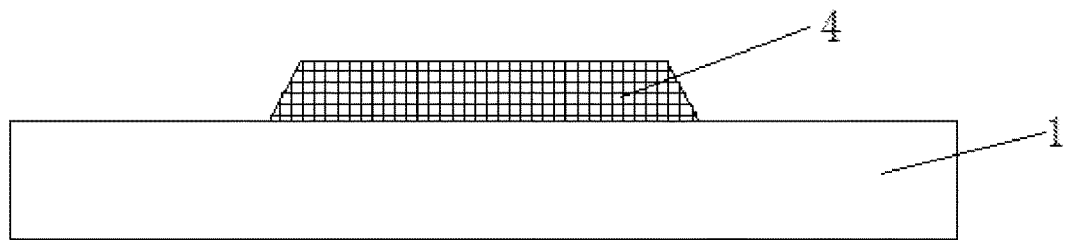
FIG. 8 is a schematic structural diagram during manufacturing a thin film transistor in an embodiment of the present disclosure.

The active layer 4 can be formed on the substrate 1 by performing a patterning process for one time. For example, the active layer 4 is firstly formed on the substrate 1 by deposition, e.g. plasma-enhanced chemical vapor deposition, and then etched, e.g., by inductively coupled plasma, so as to form the active layer 4 shown in FIG. 8.

The active layer 4 can be made of amorphous silicon, polycrystalline silicon, oxide, or the like.

Step 303: forming an etching barrier layer 5 on the active layer 4.

Figure 9:
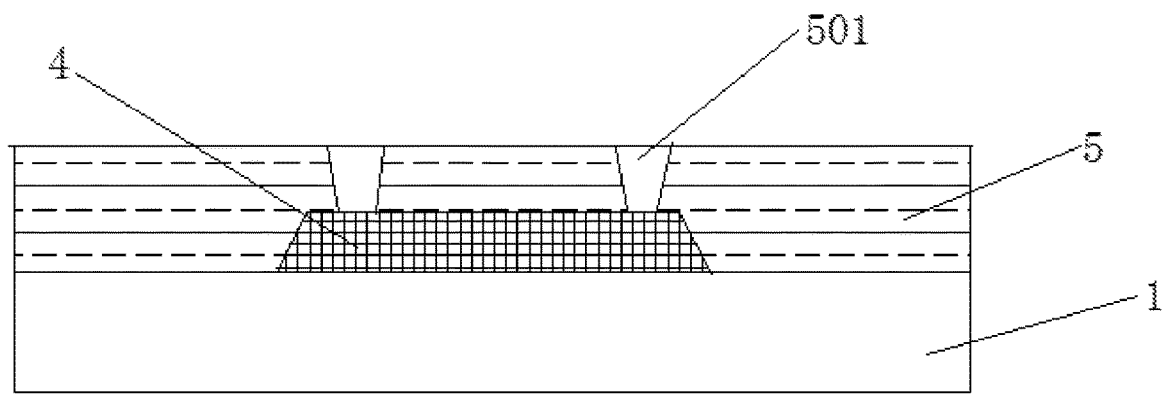
FIG. 9 is a schematic structural diagram during manufacturing a thin film transistor in an embodiment of the present disclosure.

As shown in FIG. 9, after the active layer 4 is formed, an etching barrier layer 5 may be deposited on the substrate 1 on which the active layer 4 has been formed, and the resulting etching barrier layer 5 is subjected to a patterning process for one time to form a via 501.

The etching barrier layer 5 may be made of a material such as aluminum oxide, zirconium oxide or the like.

Step 304: forming a gate electrode 2, a drain electrode A and a source electrode B on the etching barrier layer 5, wherein the drain electrode A and the source electrode B are an yttrium-doped and copper-containing first metal film.

Figure 10:
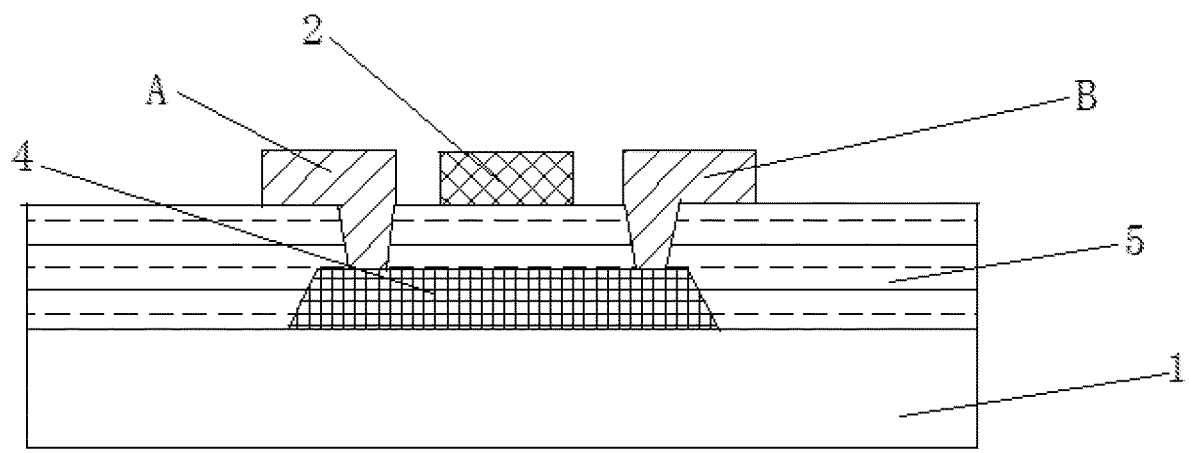
FIG. 10 is a schematic structural diagram during manufacturing a thin film transistor in an embodiment of the present disclosure.

As shown in FIG. 10, the gate electrode 2, the drain electrode A, and the source electrode B may be formed by performing a patterning process for one time on the etching barrier layer 5. For example, the gate electrode 2, the drain electrode A and the source electrode B as shown in FIG. 2 can be formed by a magnetron sputtering process followed by etching. In this case, a target for depositing at least one of the drain electrode A and the source electrode B is a copper plate doped with the yttrium element.

The gate electrode 2 may be a metal electrode, e.g. Al (aluminum), Cu (copper), Mo (molybdenum), Cr (chromium), Ti (titanium), and the like. The gate electrode 2 may also be formed by a multiple-layer metal stack.

For example, the gate electrode may be arranged as an yttrium-doped and copper-containing second metal film to improve the conductivity and oxidation resistance of the gate electrode. In order to concentrate the yttrium element in the second metal film on the surface of the second metal film to form dense oxide, it is necessary to anneal the second metal film. The annealing process of the second metal film may be performed simultaneously with the first metal film (see step 305), and the order of the above-mentioned two annealing processes is not limited herein.

Step 305: annealing the thin film transistor as a whole.

As shown in FIG. 2, after the gate electrode 2, the drain electrode A, and the source electrode B are formed on the etching barrier layer 5, the thin film transistor is annealed as a whole to form a dense oxide layer C of the complex $Y_2Cu_8$ on the surface of at least one of the drain electrode A and the source electrode B (see FIG. 2).

In the same way, the same chemical process also occurs on the gate electrode.

In an embodiment of the present disclosure, the thin film transistor (i.e., the yttrium-doped and copper-containing first and second metal film) is annealed at a temperature of 150-250° C. (e.g., 150° C., 160° C., 170° C., 180° C., 190° C., 200° C., 210° C., 220° C., 230° C., 240° C., 250° C., etc.), in an atmosphere of air, with a duration of about 0.5-1 hr (e.g., 0.5 hr, 0.6 hr, 0.7 hr, 0.8 hr, 0.9 hr, 1 hr, etc.).

Since at least one of the drain electrode A and the source electrode B in an embodiment of the present disclosure is the first metal film which is doped with the yttrium element and has been annealed, the dense oxide layer C is formed on the surface of at least one of the drain electrode A and the source electrode B respectively (see FIG. 2). In this way, it's not necessary to arrange a buffer layer on the drain electrode A or the source electrode B in the thin film transistor of the embodiment of the present disclosure, which not only simplifies the process of manufacturing the thin film transistor, but also avoids the formation of a tip structure (i.e., a roof structure) during simultaneous etching of two layers of stacked metal layers (comprising the metal layer where at least one of the drain electrode A and the source electrode B is located, and the buffer layer).

In the embodiments of the present disclosure, by arranging at least one of the drain electrode and the source electrode of the thin film transistor as a first metal film which is doped with the yttrium element and has been annealed, the conductivity and the oxidation resistance of at least one of the drain electrode and the source electrode can be improved, and the contact resistance between the drain electrode and the source electrode and the structure in contact therewith can be reduced. This makes the performance of the thin film transistor more stable. For example, the response time of the thin film transistor can be decreased.

An embodiment of the present disclosure further provides an array substrate comprising the thin film transistor illustrated in FIG. 1.

At least one of the drain electrode and the source electrode of the thin film transistor of the present disclosure is a first metal film which is doped with the yttrium element and has been annealed. The conductivity and the oxidation resistance of at least one of the drain electrode and the source electrode can be improved, and the contact resistance between the drain electrode and the source electrode and the structure in contact therewith can be reduced. This makes the performance of the thin film transistor more stable. For example, the response time of the thin film transistor can be decreased.

An embodiment of the present disclosure further provides a display panel comprising the above-mentioned array substrate.

In a specific implementation, the display panel in embodiments of the present disclosure may be any product having a display panel, such as a mobile phone, a tablet, a television, a display, a notebook computer, a digital photo frame, a navigator, and the like.

At least one of the drain electrode and the source electrode of the thin film transistor of the embodiment of the present disclosure are a first metal film which is doped with the yttrium element and has been annealed. The conductivity and the oxidation resistance of at least one of the drain electrode and the source electrode can be improved, and the contact resistance between the drain electrode and the source electrode and the structure in contact therewith can be reduced. This makes the performance of the thin film transistor more stable. For example, the response time of the thin film transistor can be decreased.

In the embodiment of the present disclosure, by using the array substrate described above in a display panel, a display panel with a low power consumption, and a high response speed can be obtained.

An embodiment of the present disclosure further provides a display device comprising the above-mentioned display panel.

In a specific implementation, the display device in embodiments of the present disclosure may be any product having a display device, such as a mobile phone, a tablet, a television, a display, a notebook computer, a digital photo frame, a navigator, and the like.

At least one of the drain electrode and the source electrode of the thin film transistor of the embodiment of the present disclosure are a first metal film which is doped with the yttrium element and has been annealed. The conductivity and the oxidation resistance of at least one of the drain electrode and the source electrode can be improved, and the contact resistance between the drain electrode and the source electrode and the structure in contact therewith can be reduced. This makes the performance of the thin film transistor more stable. For example, the response time of the thin film transistor can be decreased.

In the embodiment of the present disclosure, by using the display panel described above in a display device, a display device with a low power consumption, and a high response speed can be obtained.

All of the above-mentioned optional technical solutions can be combined to form an optional embodiment of the present disclosure in any way, and will not be further described herein.

The above description is only the preferred embodiment of the present disclosure, and is not intended to limit the disclosure. Any modifications, equivalent substitutions, and improvements, etc., which are within the spirit and principle of the present disclosure, should be included in the protection scope of the present disclosure.

What is claimed is:

1. A thin film transistor comprising;
a drain electrode,
a source electrode, and
a gate electrode, and
wherein at least one of the drain electrode the source electrode, or the gate electrode comprises a yttrium-doped and copper-containing metal film and yttrium-copper oxide on a surface of the metal film.

2. The thin film transistor according to claim 1, wherein the metal film comprises copper or a copper alloy.

3. The thin film transistor according to claim 2,
wherein the metal film comprises copper, and
wherein yttrium is doped by a mass fraction of less than about 0.06% and more than about 0:005%.

4. The thin film transistor according to claim 3, wherein the yttrium is doped by a mass fraction of about 0.02%.

5. The thin film transistor according to claim 1, wherein the yttrium-copper oxide on the surface of the metal film is formed by annealing.

6. The thin film transistor according to claim 1, wherein the yttrium-copper oxide on the surface of the metal film comprises oxide of a complex $Y_2Cu_8$.

7. A method of manufacturing a thin film transistor, comprising:
forming a drain electrode, a source electrode, and a gate electrode, wherein at least one of the drain electrode, the source electrode, or the gate electrode comprises a yttrium-doped and copper-containing metal film; and
forming yttrium-copper oxide on a surface of the metal film.

8. The method according to claim 7, wherein the metal film comprises copper or a copper alloy.

9. The method according to claim 8, wherein the metal film comprises copper, and yttrium is doped by a mass fraction of less than about 0.06% and more than about 0.005%.

10. The method according to claim 9, wherein the yttrium is doped by a mass fraction of about 0.02%.

11. The method according to claim 7, wherein the forming the yttrium-copper oxide on the surface of the metal film comprises:
annealing the metal film to form yttrium-copper oxide on the surface of the metal film.

12. The method according to claim 7, wherein the forming yttrium-copper oxide on the surface of the metal film comprises:
annealing the first metal film to form oxide of a complex $Y_2Cu_8$ on the surface of the metal film.

13. An array substrate, comprising the thin film transistor of claim 1.

14. A display panel, comprising the array substrate of claim 13.

15. A display device, comprising the display panel of claim 14.

* * * * *